(12) United States Patent
Singh et al.

(10) Patent No.: US 10,504,774 B2
(45) Date of Patent: Dec. 10, 2019

(54) LITHOGRAPHIC PATTERNING TO FORM FINE PITCH FEATURES

(71) Applicant: GLOBALFOUNDRIES Inc., Grand Cayman (KY)

(72) Inventors: Sunil K. Singh, Mechanicville, NY (US); Sohan S. Mehta, Saratoga Springs, NY (US); Sherjang Singh, Clifton Park, NY (US); Ravi P. Srivastava, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 262 days.

(21) Appl. No.: 15/214,585

(22) Filed: Jul. 20, 2016

(65) Prior Publication Data

US 2018/0025936 A1  Jan. 25, 2018

(51) Int. Cl.
*H01L 21/311* (2006.01)
*H01L 21/768* (2006.01)
*H01L 21/027* (2006.01)
*H01L 21/033* (2006.01)

(52) U.S. Cl.
CPC .... *H01L 21/76802* (2013.01); *H01L 21/0274* (2013.01); *H01L 21/0332* (2013.01); *H01L 21/0337* (2013.01); *H01L 21/31144* (2013.01); *H01L 21/76877* (2013.01)

(58) Field of Classification Search
CPC ......... H01L 21/31144; H01L 21/76802; H01L 21/76816; H01L 21/76879
USPC ............................................ 430/273.1, 271.1
See application file for complete search history.

(56) References Cited

U.S. PATENT DOCUMENTS

| 9,117,822 B1 * | 8/2015 | Singh ................ H01L 23/53238 |
| 9,372,402 B2 | 6/2016 | Freedman et al. |
| 2004/0170916 A1 * | 9/2004 | Kouchiyama .......... B82Y 10/00 |
| | | 430/270.1 |
| 2016/0190003 A1 | 6/2016 | Singh |

\* cited by examiner

*Primary Examiner* — Daborah Chacko-Davis
(74) *Attorney, Agent, or Firm* — Thompson Hine LLP; Francois Pagette

(57) ABSTRACT

Methods of lithographic patterning to form interconnect structures for a chip. A hardmask layer is formed on a dielectric layer. A sacrificial layer is formed on the hardmask layer. First opening and second openings are formed in the sacrificial layer that extend through the sacrificial layer to the hardmask layer. A resist layer is formed on the sacrificial layer. An opening is formed in the resist layer that is laterally located between the first opening in the first sacrificial layer and the second opening in the first sacrificial layer. The resist layer is comprised of a metal oxide resist material that is removable selective to the hardmask layer.

20 Claims, 6 Drawing Sheets

LITHOGRAPHIC PATTERNING TO FORM FINE PITCH FEATURES

BACKGROUND

The present invention relates to integrated circuits and semiconductor device fabrication and, more specifically, to methods of lithographic patterning to form interconnect structures for a chip.

A back-end-of-line (BEOL) interconnect structure may be used to electrically couple device structures fabricated on a substrate during front-end-of-line (FEOL) processing. The BEOL interconnect structure may be formed using a dual-damascene process in which via openings and trenches etching in a dielectric layer are simultaneously filled with metal to create a metallization level. In a via-first, trench-last dual damascene process in which via openings are formed in a dielectric layer and then a trench is formed in the dielectric layer above the via openings, the via openings are unfilled during the etching process forming the trenches. In a single-damascene process, the via openings and trench are formed in different dielectric layers and filled separately with metal.

Dry etch processes are commonly used to fabricate trenches and vias during dual-damascene processing involving copper and a low-k dielectric material. As the semiconductor device technology node advances to smaller dimensions, the decreasing size of semiconductor devices increased the difficulty of controlling the profile of vias and trenches. Metal hardmasks have been utilized to improve etch selectivity to low-k dielectric materials and, thereby, to improve profile control. As feature sizes shrink in advanced semiconductor device technology nodes to 7 nm and below, the ability to form features in a low-k dielectric material with multi-patterning techniques becomes increasingly more challenging.

Improved methods of lithographic patterning to form interconnect structures for a chip are needed.

SUMMARY

According to an embodiment of the invention, a method is provided for forming an interconnect level. The method includes forming a hardmask layer on a dielectric layer, forming a sacrificial layer on the hardmask layer, and forming first and second openings in the sacrificial layer extending through the sacrificial layer to the hardmask layer. The method further includes forming a first resist layer on the sacrificial layer, and forming an opening in the resist layer that is laterally located between the first opening in the sacrificial layer and the second opening in the sacrificial layer. The resist layer is comprised of a metal oxide resist material that is removable selective to the hardmask layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
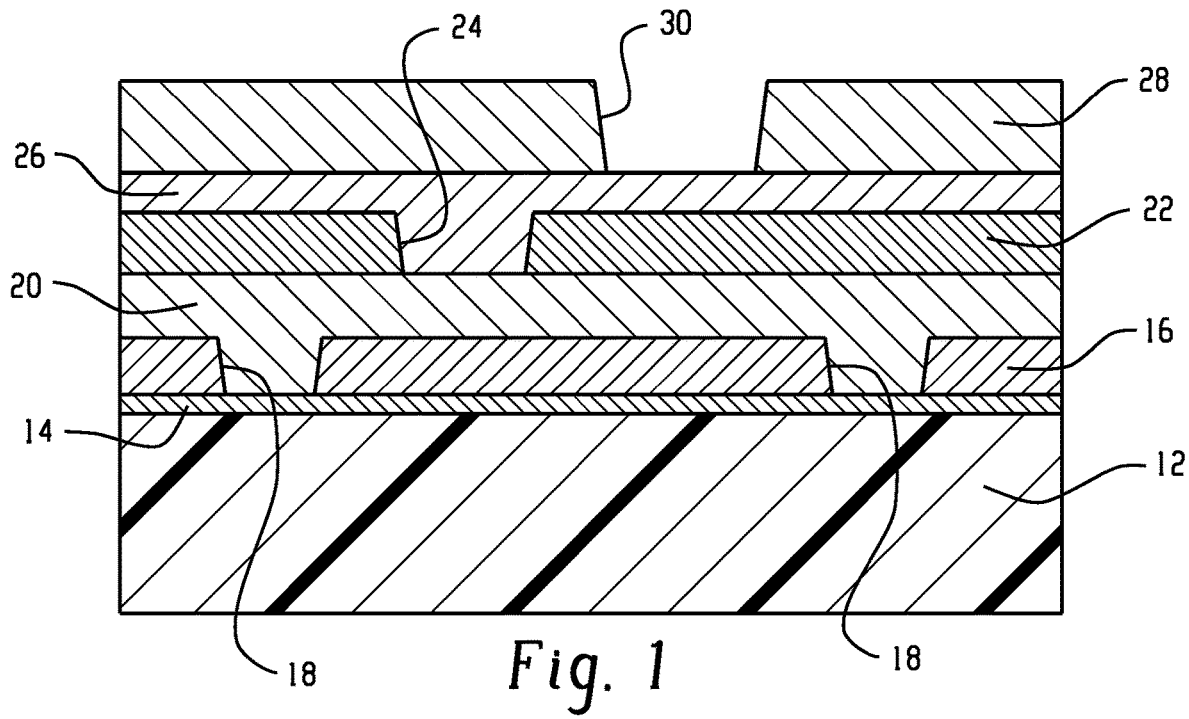
FIGS. 1-9 are cross-sectional views at successive fabrication stages of a processing method in accordance with an embodiment of the invention in order to form an interconnect structure.
Figure 9:
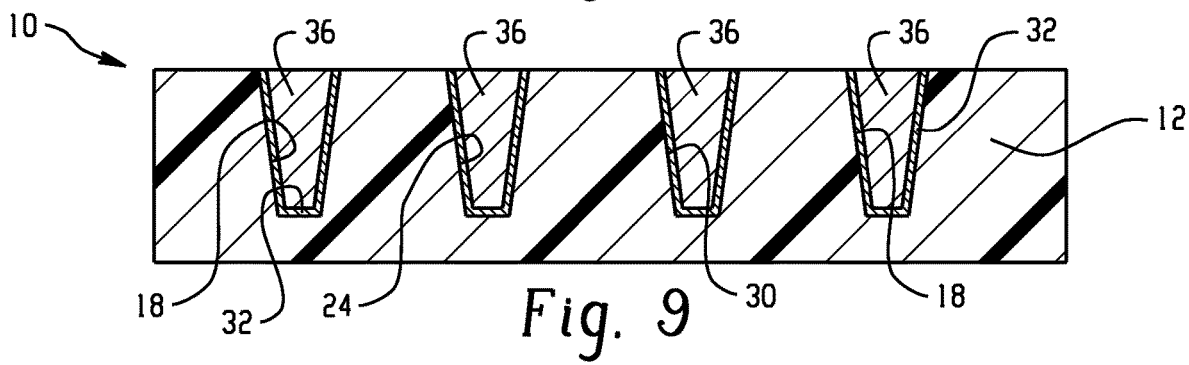

With reference to FIG. 1 and in accordance with an embodiment of the invention, a dielectric layer 12 is processed according to the processing method to form an interconnect structure of a metallization level 10 (FIG. 9). The dielectric layer 12 may be formed on a substrate (not shown) comprised of, for example, a semiconductor material suitable for forming an integrated circuit and including device structures fabricated by front-end-of-line (FEOL) processing to form the integrated circuit. The dielectric layer 12 may be composed of an electrically-insulating dielectric material, such as a low-k dielectric material characterized by a relative permittivity or dielectric constant that is less than the dielectric constant of silicon dioxide ($SiO_2$), which is about 3.9. Candidate low-k dielectric materials for dielectric layer 12 may be characterized by a dielectric constant of less than or equal to 3.0, and may include, but are not limited to, dense and porous organic low-k dielectrics, dense and porous inorganic low-k dielectrics, and combinations of such organic and inorganic dielectrics.

A hardmask layer 14 is formed as a sacrificial film on a top surface of the dielectric layer 12. A resist layer 16 is formed as a sacrificial film on the hardmask layer 14 and patterned to form openings 18. Specifically, the resist layer 16 may be applied by spin-coating, pre-baked, exposed to a pattern of radiation from an exposure source projected through a photomask, baked after exposure, and developed with a chemical developer to form the openings 18 situated at the intended locations for corresponding openings to be formed in the dielectric layer 12. A dielectric layer 20 and a resist layer 22 are successively formed as sacrificial films on the resist layer 16. Portions of the dielectric layer 20 fill the openings 18 in the resist layer 16. The resist layer 22 may be baked, exposed to a pattern of radiation from an exposure source projected through a photomask, and developed as part of a patterning process to form a corresponding pattern of openings 24 situated at the intended locations for corresponding openings to be formed in the dielectric layer 12. As shown in FIG. 1, one of the openings 24 in the resist layer 22 may be located between an adjacent pair of the openings 18.

A dielectric layer 26 and a resist layer 28 are successively formed as sacrificial films on the resist layer 22. Portions of the dielectric layer 26 fill the openings 24. The resist layer 28 may be baked, exposed to a pattern of radiation from an exposure source projected through a photomask, and developed as part of a patterning process to form a corresponding pattern of openings 30 situated at the intended locations for corresponding openings to be formed in the dielectric layer 12. As shown in FIG. 1, one of the openings 30 in the resist layer 28 may be located between an adjacent pair of the openings 18 and, more specifically, may be located between the opening 24 and one of the openings 18. Both of the openings 24, 30 may be located between the same adjacent pair of the openings 18. The openings 18, 24, 30 may be displaced relative to each other by offset distances that ensure that openings subsequently formed in the dielectric layer 12 are placed relative to each other by a given fine pitch.

The openings 18, 24, 30 in the respective resist layers 16, 22, 28 may be formed by photolithography and etching.

Specifically, each of the resist layers 16, 22, 28 may be applied, exposed to a pattern of radiation projected through a photomask, and developed to form the respective openings 18, 24, 30. The dielectric layers 20, 26 may be applied and planarized using, for example, a chemical mechanical polishing (CMP) process.

All of the layers 14, 16, 20, 22, 26, 28 constitute sacrificial films or layers that are used in combination to pattern openings in the dielectric layer 12 vertically coincident with openings 18, 24, 30 and that take advantage of etching processes that selectively targeted the various different materials for removal in order to transfer the openings 18, 24, 30 into the dielectric layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

The material constituting the hardmask layer 14 may be an electrical insulator, such as silicon oxynitride (SiON), silicon dioxide ($SiO_2$) or silicon nitride ($Si_3N_4$), that may be deposited by chemical vapor deposition (CVD). The material constituting the dielectric layers 20, 26 may be comprised of a layer of an organic material, such as an organic planarization layer (OPL) or SOH, that may be applied by a spin coating process and baked to establish a stability.

In an embodiment, the material constituting the resist layers 16, 22, 28 may be a metal oxide resist, also known as a molecular organometallic resist, that is directly patternable using an exposure source, such as an extreme ultraviolet (EUV) exposure source, and a photomask, and etchable with a higher selectivity than organic films such as conventional photoresists. The metal oxide resist may include molecular or organometallic compounds that utilize metal centers with a high EUV optical density. A metal oxide resist may include an inorganic metal oxide core of, for example, zirconium dioxide ($ZrO_2$) or hafnium oxide ($HfO_2$), an organic ligand shell composed of, for example, carboxylic or sulfonic acid, and a photo-reactive compound needed to promote imaging.

Figure 2:
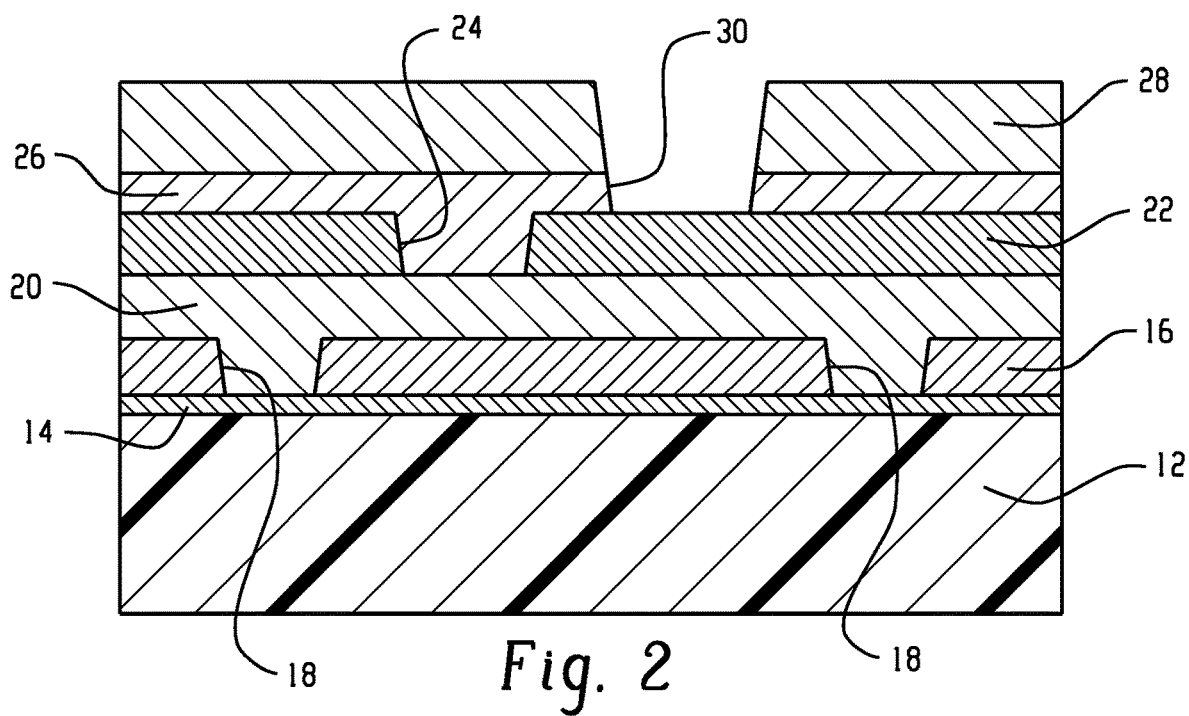

With reference to FIG. 2 in which like reference numerals refer to like features in FIG. 1 and at a subsequent fabrication stage, the dielectric layer 26 may be stripped by a cleaning or etching process to extend the openings 30 in the resist layer 28 vertically through the dielectric layer 26 to the top surface of the resist layer 22. The etch chemistry of the etching process may be selected to remove the constituent material of the dielectric layer 26 selective to the material of the resist layers 22, 28. The resist layer 28 functions as an etch mask during the stripping process patterning the dielectric layer 26 to form the openings 30, and the resist layer 22 functions as an etch stop.

Figure 3:
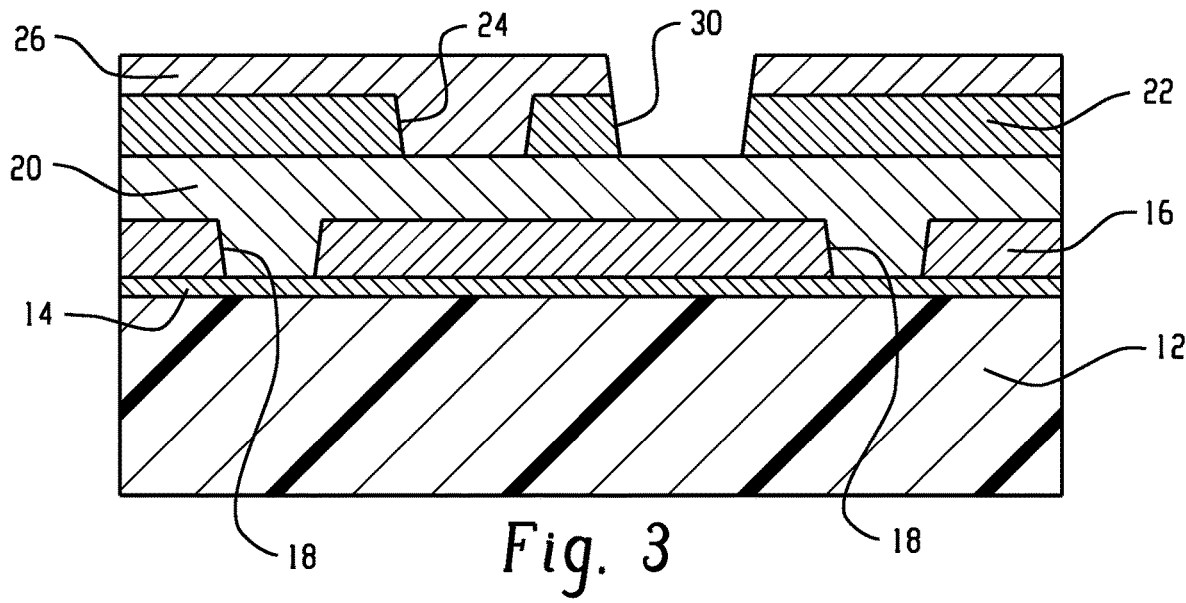

With reference to FIG. 3 in which like reference numerals refer to like features in FIG. 2 and at a subsequent fabrication stage, the resist layer 28 may be removed and the resist layer 22 may be etched at the locations of the openings 30 by an etching process using an etch chemistry selected to remove the constituent material of the resist layers 22, 28 selective to the constituent material(s) of the dielectric layers 20, 26. The openings 30 are extended by the etching process vertically through the resist layer 22 to the top surface of the dielectric layer 20. The dielectric layer 26 functions as an etch mask during the etching process patterning the resist layer 22 to form the openings 30, and the dielectric layer 20 functions as an etch stop.

Figure 4:
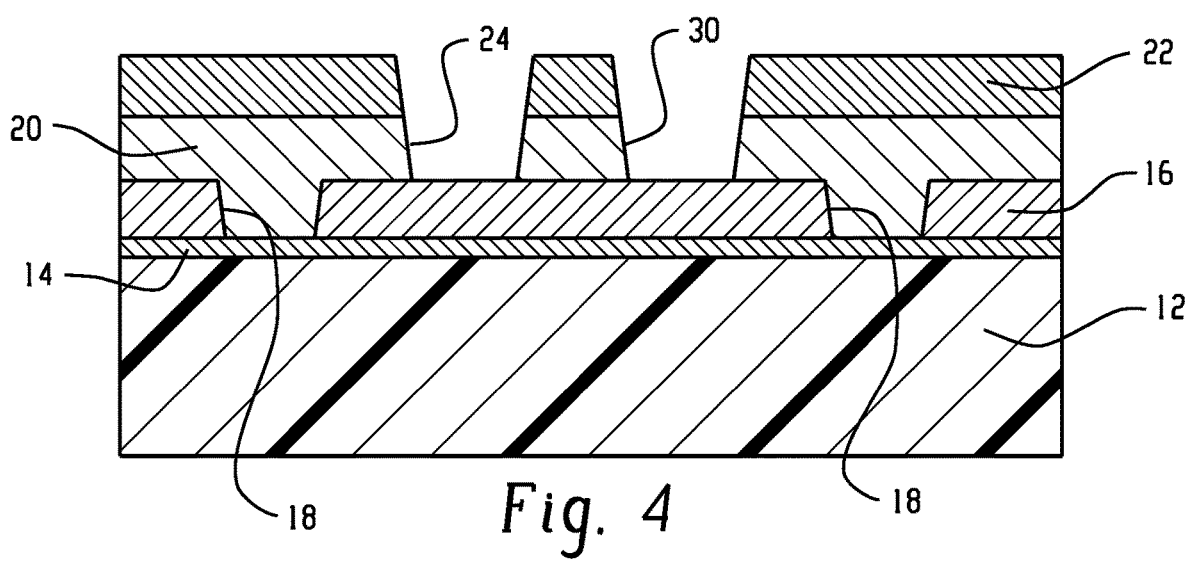

With reference to FIG. 4 in which like reference numerals refer to like features in FIG. 3 and at a subsequent fabrication stage, the dielectric layer 26 is stripped from the resist layer 22, the openings 24 in resist layer 22 are cleared of the portions of the dielectric layer 26, and the dielectric layer 20 is etched at the location of the openings 24, 30, by a cleaning or etching process using an etch chemistry selected to remove the constituent dielectric material(s) of layers 20, 26 selective to the constituent material of the resist layers 16, 22. The openings 24, 30 are extended by the stripping process vertically through the dielectric layer 20 to the top surface of the resist layer 16. The resist layer 22 functions as an etch mask during the stripping process patterning the dielectric layer 20 to form the openings 24, 30, and the resist layer 16 functions as an etch stop.

Figure 5:
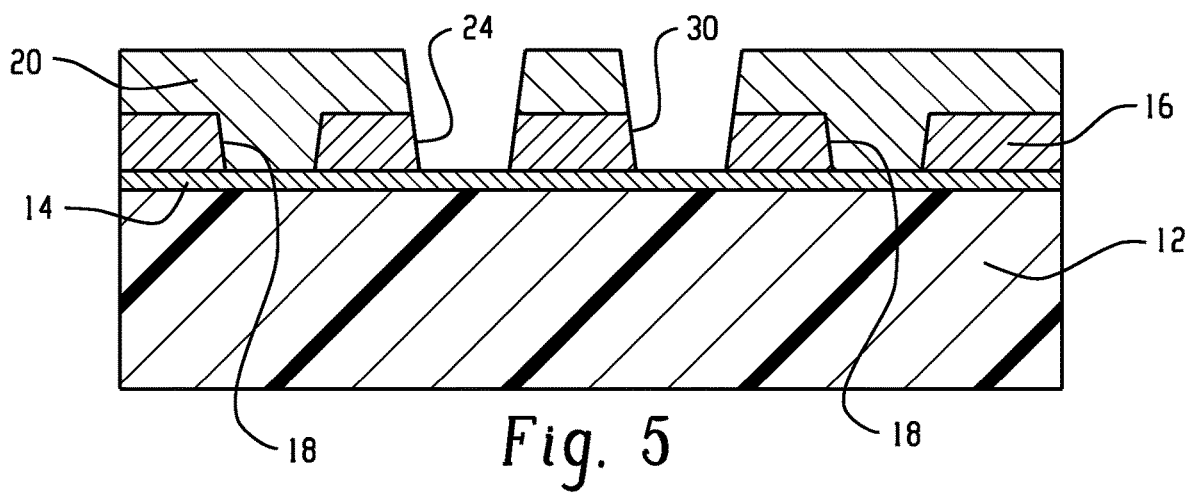

With reference to FIG. 5 in which like reference numerals refer to like features in FIG. 4 and at a subsequent fabrication stage, the resist layer 22 is removed and the resist layer 16 is etched at the locations of the openings 24, 30 by an etching process using an etch chemistry selected to remove the constituent material of the resist layers 16, 22 selective to the constituent material of the dielectric layer 20. The openings 24 and 30 are extended vertically by the etching process through the resist layer 16 to the top surface of the hardmask layer 14. The dielectric layer 20 functions as an etch mask during the etching process patterning the resist layer 16 to form the openings 24, 30, and the hardmask layer 14 functions as an etch stop.

Figure 6:
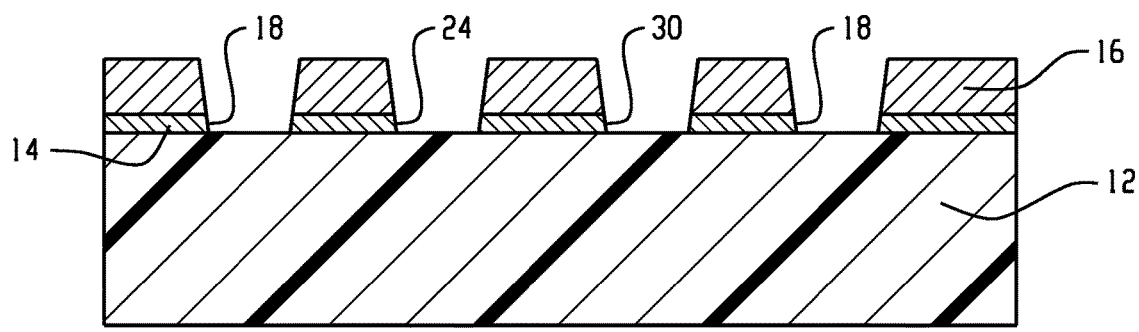

With reference to FIG. 6 in which like reference numerals refer to like features in FIG. 5 and at a subsequent fabrication stage, the dielectric layer 20 is stripped by a cleaning or etching process to clear the openings 18. The hardmask layer 14 is subsequently etched at the locations of the openings 18, 24, 30 by an etching process using an etch chemistry selected to remove the constituent material of the hardmask layer 14 selective to the materials of the resist layer 16 and the dielectric layer 12. The openings 18, 24, 30 are extended by the etching process vertically through the hardmask layer 14 to the top surface of the dielectric layer 12. The resist layer 18 functions as an etch mask during the etching process patterning the hardmask layer 14 to form the openings 18, 24, 30, and the dielectric layer 12 functions as an etch stop.

Figure 7:
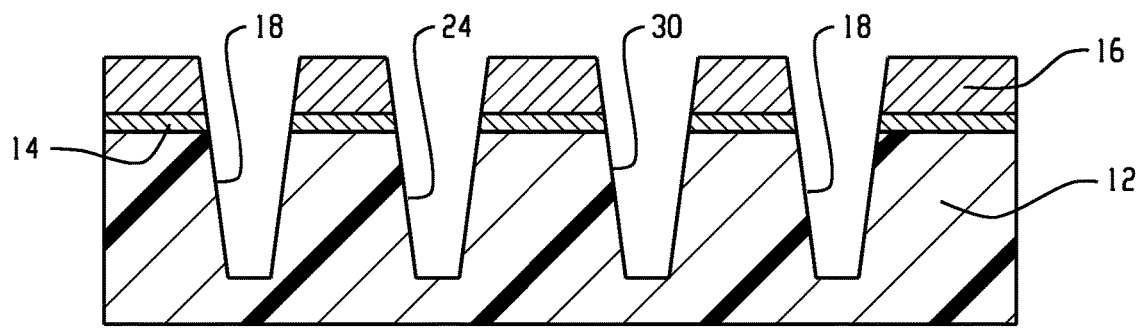

With reference to FIG. 7 in which like reference numerals refer to like features in FIG. 6 and at a subsequent fabrication stage, the dielectric layer 12 is etched at the locations of the openings 18, 24, 30 by an etching process using an etch chemistry selected to remove the constituent material of the dielectric layer 12 selective to the materials of the resist layer 16 and the hardmask layer 14. The openings 18, 24, 30 are extended vertically to a given depth of penetration into the dielectric layer 12. The resist layer 16 and the hardmask layer 14 function as an etch mask during the etching process patterning the dielectric layer 12 to form the openings 18, 24, 30. The etching process used to etch the dielectric layer 12 may comprise a wet chemical etching process or a dry etching process, such as reactive-ion etching (ME), and may be timed to provide the given depth of penetration.

The openings 18, 24, 30 in the dielectric layer 12 represent features having a fine pitch due to the multiple-patterning approach used by the fabrication process. The openings 18, 24, 30 are formed with a minimal number of dielectric layers 20, 26 in the multiple sacrificial layers in the initial layer stack that is applied as shown in FIG. 1.

Figure 8:
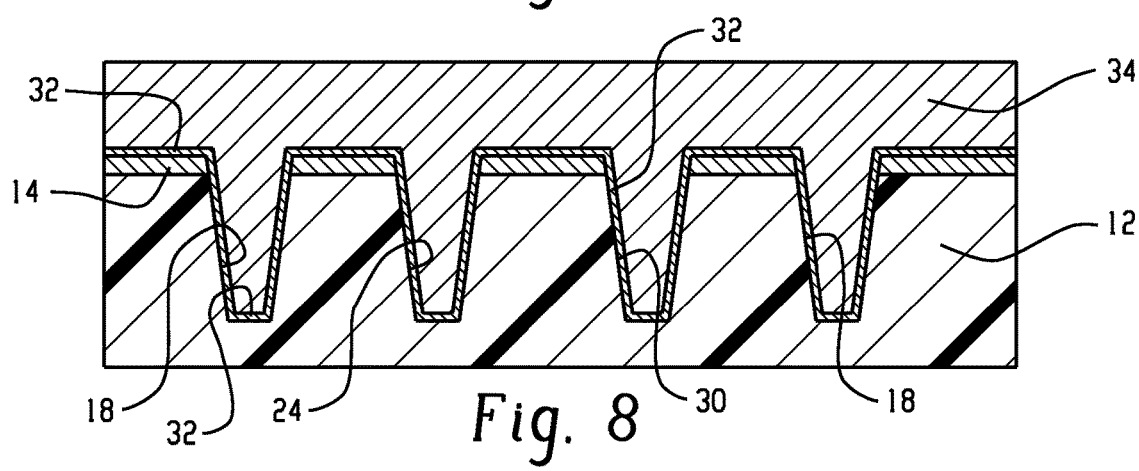

With reference to FIG. 8 in which like reference numerals refer to like features in FIG. 7 and at a subsequent fabrication stage, the resist layer 16 is removed using either a dry or wet cleaning process having a suitable etch chemistry. If the resist layer 16 is composed of a metal oxide resist, the resist layer 16 may be removed more easily than, for example, a metal resist layer comprised of, for example, titanium nitride (TiN).

A barrier/liner layer 32 of a given thickness is deposited on the sidewalls and base of the openings 18, 24, 30 in the dielectric layer 12, and is also applied in the field area on the top surface of the dielectric layer 12. The barrier/liner layer 32 may be comprised of titanium (Ti), titanium nitride (TiN), tantalum (Ta), tantalum nitride (TaN), or a layered combination of these materials (e.g., a TaN/Ta bilayer) deposited by physical vapor deposition (PVD) with, for example, a sputtering process or by atomic layer deposition (ALD). A seed layer (not shown) may be formed that covers the barrier/liner layer 32 inside the openings 18, 24, 30 and that also covers the top surface of the hardmask layer 14 and dielectric layer 12 in the field area. The seed layer may be comprised of elemental copper (Cu) that is deposited by PVD with, for example, a sputtering process. After the deposition of the seed layer, a thicker metal layer 34 comprised of a low-resistivity metal, such as copper (Cu), may be deposited using a deposition process, such as electroplating or another electrochemical plating process. The seed layer may be required to carry the electrical current needed to perform an electroplating process forming the metal layer 34. Alternatively, the metal layer 34 may be deposited with an electroless deposition process, which would permit the seed layer to be omitted.

With reference to FIG. 9 in which like reference numerals refer to like features in FIG. 8 and at a subsequent fabrication stage, the metal layer 34, the seed layer, the barrier/liner layer 32, and the hardmask layer 14 are removed from the field area on the top surface of dielectric layer 12 by planarization, such as with one or more CMP processes. Each CMP process may be conducted with a commercial tool using standard polishing pads and slurries selected to polish the targeted material. Following planarization, the interconnect structure of the metallization level 10 includes portions 36 of the metal layer 34 that are located inside the openings 18, 24, 30. These portions 36 may represent wires in trenches serving as the openings 18, 24, 30, via plugs in vias serving as the openings 18, 24, 30, or contacts in contact holes serving as the openings 18, 24, 30. Each of these structures may be used in an interconnect structure to couple devices of an integrated circuit, to provide circuit-to-circuit connections, and/or to communicate signals to and from I/O terminals.

Figure 10:
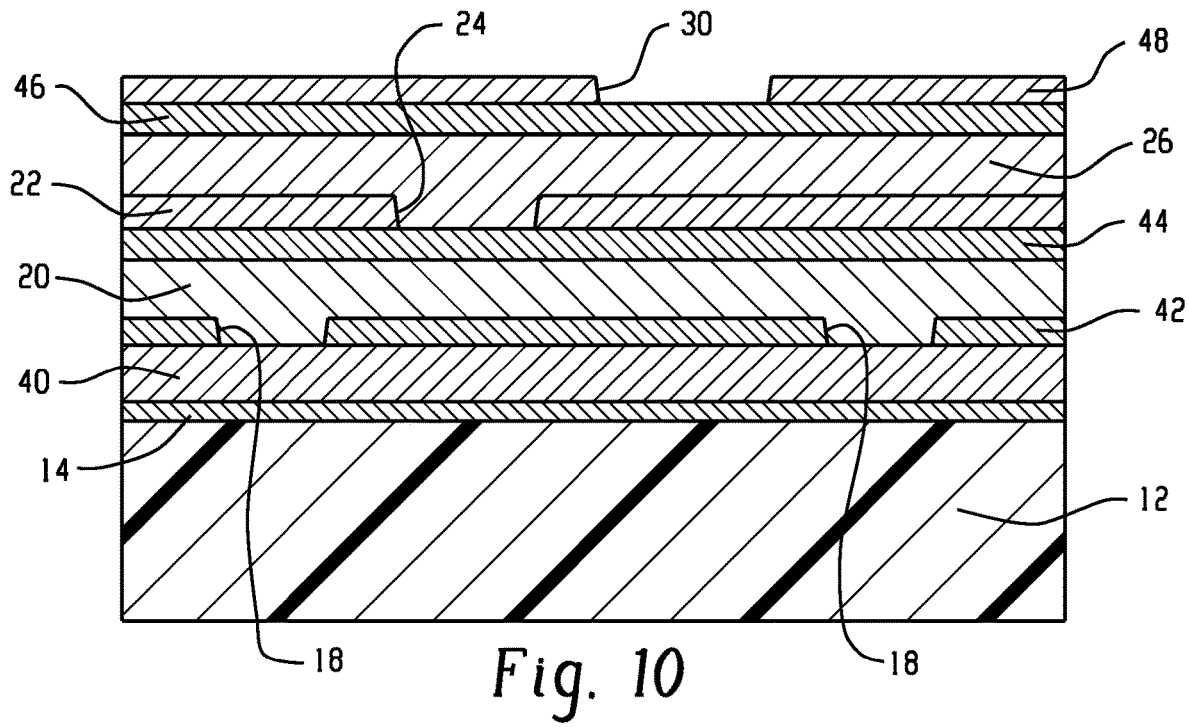
FIGS. 10-16 are cross-sectional views of a processing method at successive fabrication stages in accordance with an alternative embodiment of the invention in order to form an interconnect structure.

With reference to FIG. 10 in which like reference numerals refer to like features in FIG. 1 and at an initial fabrication stage of a processing method in accordance with an alternative embodiment of the invention, a metal hardmask layer 40 is formed on the hardmask 14, and a dielectric layer 42 is formed on the metal hardmask layer 40 and is constituted by a material that etches selective to the material of the metal hardmask layer 40. The metal hardmask layer 40 is constituted by a material that etches selective to the material of the hardmask 14. The dielectric layer 42 may be patterned by applying an organic resist layer (not shown) with spin-coating, exposing the organic resist layer to a pattern of radiation from an exposure source projected through a photomask, and developing with a chemical developer to form openings situated at the intended locations for corresponding openings 18 to be formed in the dielectric layer 12, and then etching the dielectric layer 42 with the organic resist layer present. The metal hardmask layer 40 may operate as an etch stop when the openings 18 are formed. The organic resist layer is stripped after the openings 18 are formed in the metal hardmask layer 40.

The dielectric layer 20 and the resist layer 22 are formed as sacrificial films, openings 24 are formed in the resist layer 22, and portions of the dielectric layer 20 fill the openings 18. Before the resist layer 22 is formed, a dielectric layer 44 is formed as an additional sacrificial film on the dielectric layer 20 and is constituted by a material that etches selective to the materials of the dielectric layer 20 and resist layer 22. Dielectric layer 26 is formed as a sacrificial film on the resist layer 22 as described hereinabove such that portions of the dielectric layer 26 fill the openings 24.

A dielectric layer 46 constituted by a material that etches selective to the dielectric layer 26 is formed on the dielectric layer 26. A photoresist layer 48 is formed on the dielectric layer 26 by spin-coating, pre-baking, exposing the photoresist layer to a pattern of radiation from an exposure source projected through a photomask, baking, and developing the exposed photoresist layer with a chemical developer to form openings 30 situated at the intended locations for corresponding openings to be formed in the dielectric layer 12.

In an embodiment, the material constituting the metal resist layer 40 may be titanium nitride (TiN) deposited by PVD or ALD. The material constituting each of the dielectric layers 44, 46 may be silicon carbon nitride (SiCN) or silicon carbon oxynitride (SiCON) deposited by CVD. The dielectric layer 42 may be comprised of an electrical insulator, such as silicon oxynitride (SiON), silicon dioxide ($SiO_2$) or silicon nitride ($Si_3N_4$) deposited by chemical vapor deposition. In an embodiment, the dielectric layer 42 may be comprised of the same dielectric material as the hardmask 14.

Figure 11:
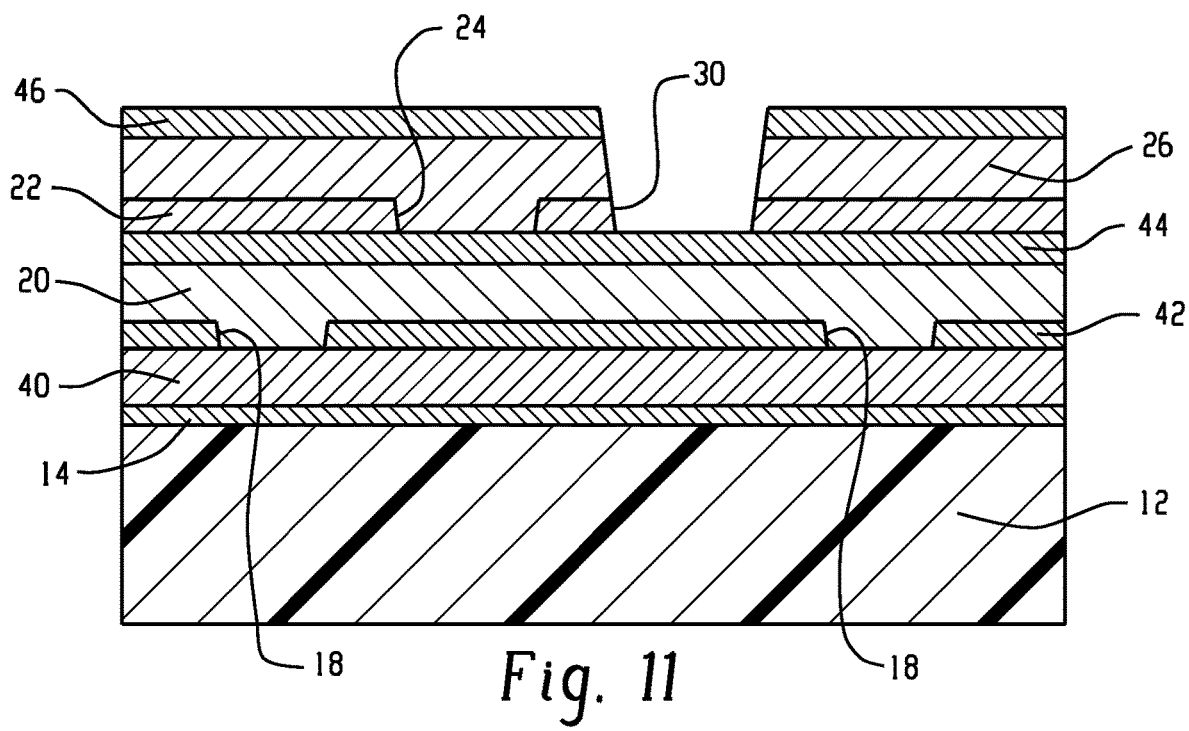

With reference to FIG. 11 in which like reference numerals refer to like features in FIG. 10 and at a subsequent fabrication stage, the dielectric layer 46 is etched at the location of openings 30 by an etching process using an etch chemistry selected to remove the constituent material of the dielectric layer 46 selective to the constituent material of the organic resist layer 48. The openings 30 are extended vertically by the etching process through the dielectric layer 46 to the top surface of resist layer 22. The organic resist layer 48 functions as an etch mask during the etching process patterning the dielectric layer 46 to add the openings 30, and the dielectric layer 26 functions as an etch stop. The organic resist layer 48 may be subsequently stripped.

The dielectric layer 26 is subsequently stripped at the locations of openings 30 by a cleaning or etching process using an etch chemistry selected to remove the constituent material of the dielectric layer 26 selective to the constituent material of the dielectric layer 46. The openings 30 are extended vertically by the etching process through the dielectric layer 26 to the top surface of the resist layer 22. The dielectric layer 46 functions as an etch mask during the stripping process patterning the dielectric layer 26 to form the openings 30, and the resist layer 22 functions as an etch stop.

The resist layer 22 is subsequently etched at the locations of the openings 30 by an etching process using an etch chemistry selected to remove the constituent material of the resist layer 22 selective to the constituent material of the dielectric layer 44. The openings 30 are extended by the etching process vertically through the resist layer 22 to the top surface of dielectric layer 44. The dielectric layer 46 function as an etch mask during the etching process patterning the resist layer 22 to form the openings 30, and the dielectric layer 44 functions as an etch stop.

Figure 12:
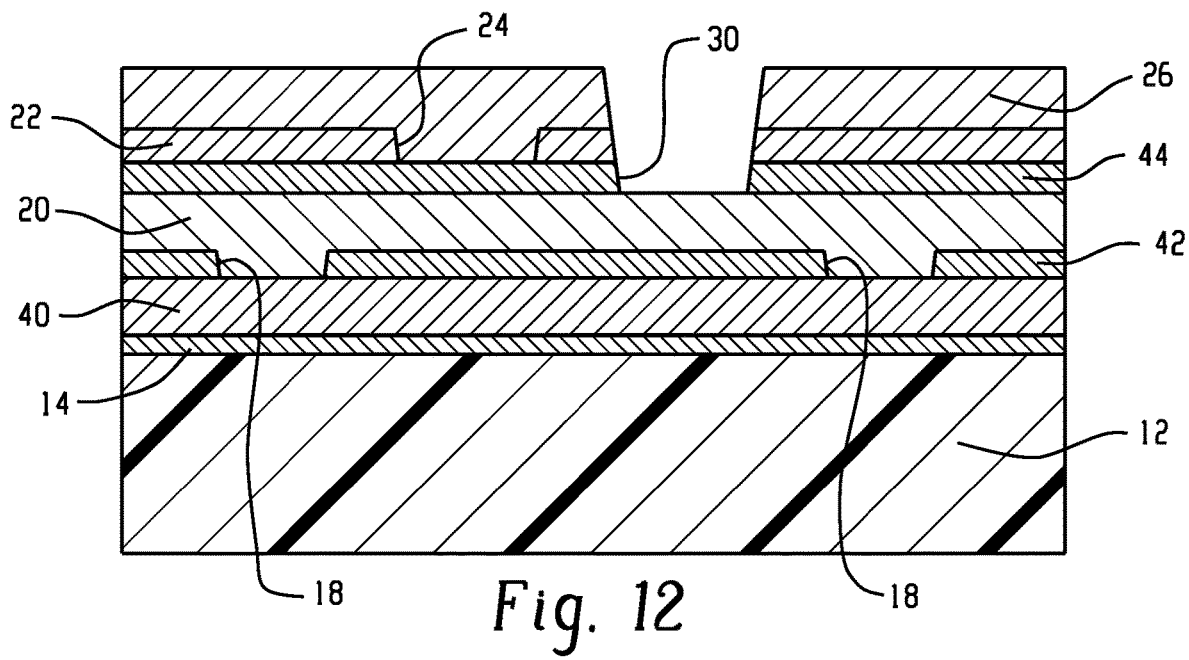

With reference to FIG. 12 in which like reference numerals refer to like features in FIG. 11 and at a subsequent fabrication stage, the dielectric layer 46 is removed and the dielectric layer 44 is etched at the locations of the openings 30 by an etching process using an etch chemistry selected to remove the constituent materials of dielectric layers 44, 46 selective to the constituent materials of the dielectric layers 20, 26. The openings 30 are extended by the etching process vertically through the dielectric layer 44 to the top surface of the dielectric layer 20. The dielectric layer 26 functions as an etch mask during the etching process patterning the dielectric layer 44 to form the openings 30, and the dielectric layer 20 functions as an etch stop.

Figure 13:
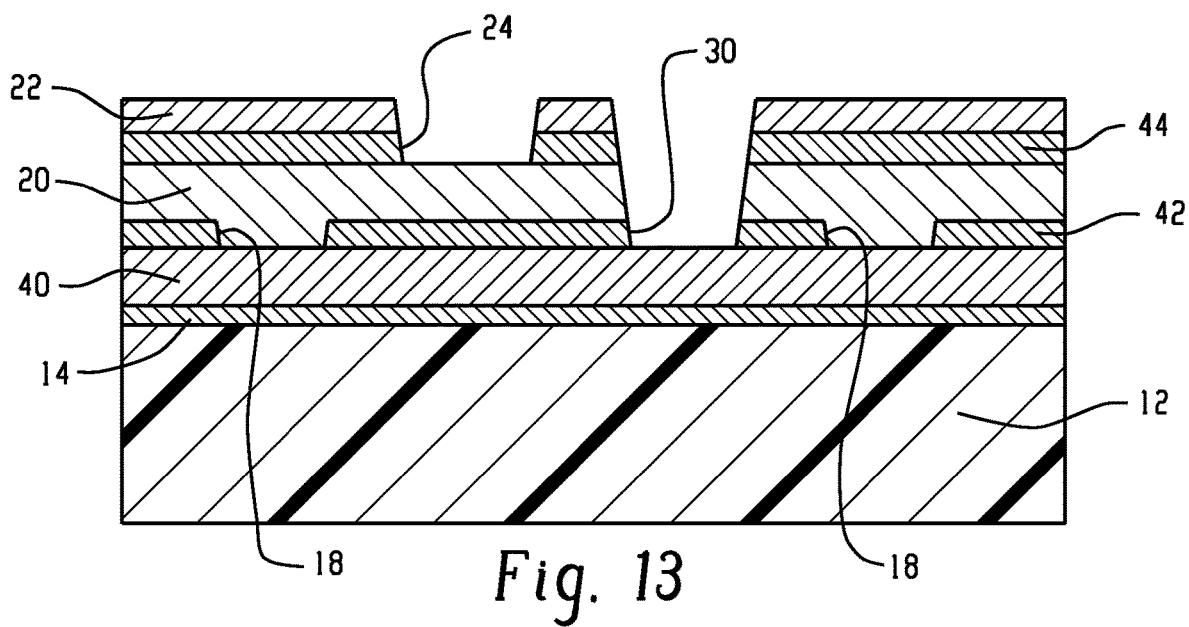

With reference to FIG. 13 in which like reference numerals refer to like features in FIG. 12 and at a subsequent fabrication stage, the dielectric layer 26 is stripped from the resist layer 22, the openings 24 in resist layer 22 are cleared of the portions of the dielectric layer 26, and the dielectric layer 20 is etched at the location of the openings 30, by a cleaning or etching process using an etch chemistry selected to remove the constituent material(s) of dielectric layers 20, 26 selective to the constituent material(s) of the dielectric layers 42, 44. The openings 30 are extended by the stripping process vertically through the dielectric layer 20 to the top surface of the dielectric layer 42. The resist layer 22 functions as an etch mask during the stripping process patterning the dielectric layer 20 to form the openings 30, and the dielectric layers 42, 44 function as etch stops.

The dielectric layers 42, 44 are etched by an etching process using an etch chemistry selected to remove the constituent material selective to the constituent materials of the dielectric layer 20 and the metal hardmask layer 40. The openings 30 are extended by the etching process vertically through the dielectric layer 42 to the top surface of the metal hardmask layer 40, which functions as an etch stop. The openings 24 are extended by the etching process vertically through the dielectric layer 44 to the top surface of the dielectric layer 20, which functions as an etch stop. The resist layer 22 functions as an etch mask during the stripping process patterning the dielectric layer 42 to form the openings 30 and patterning the dielectric layer 44 to form the openings 24.

Figure 14:
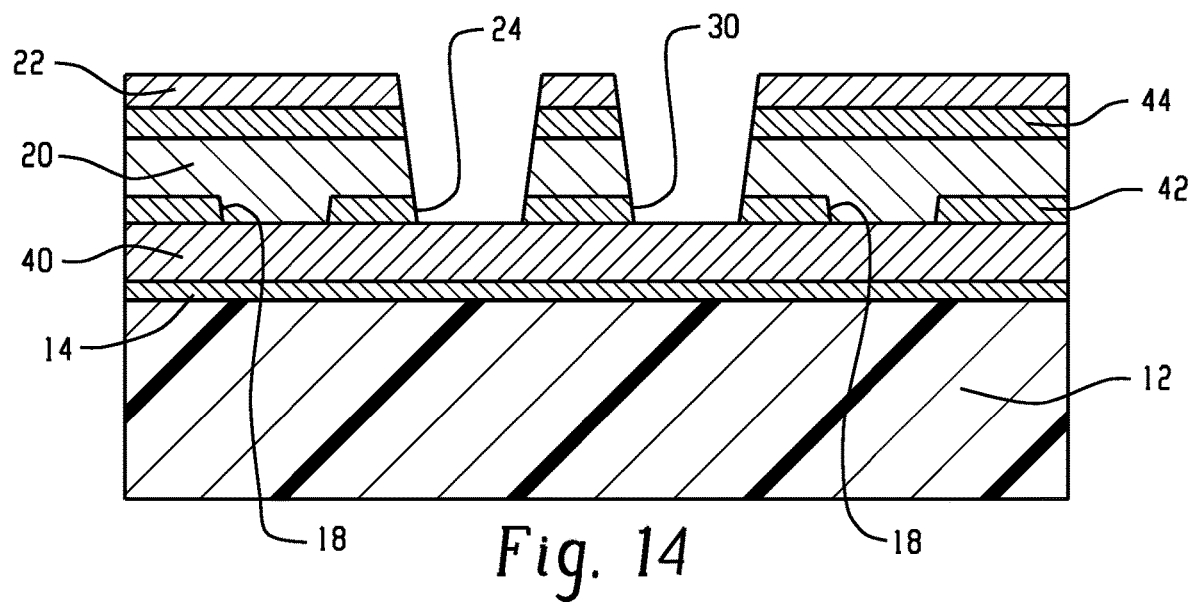

With reference to FIG. 14 in which like reference numerals refer to like features in FIG. 13 and at a subsequent fabrication stage, the dielectric layer 20 is stripped by a cleaning or etching process using an etch chemistry selected to remove the constituent material of the dielectric layer 20 selective to the constituent material of the dielectric layer 42. The openings 24 are extended by the etching process vertically through the dielectric layer 20 and to the top surface of the dielectric layer 42. However, the openings 30 are not extended into the metal hardmask layer 40. The resist layer 22 functions as an etch mask during the stripping process patterning the dielectric layer 20 to form the openings 30, and the dielectric layer 42 and the metal hardmask layer 40 function as etch stops.

The dielectric layer 42 is then etched by an etching process using an etch chemistry selected to remove the constituent material of the dielectric layer 42 selective to the constituent material of the metal hardmask layer 40 in order to extend the openings 24 through the dielectric layer 42 and to the top surface of the metal hardmask layer 40. The resist layer 22 functions as an etch mask during the etching process patterning the dielectric layer 42 to form the openings 24, and the metal hardmask layer 40 functions as an etch stop.

At this point in the fabrication process, the openings 24 and 30 both extend to the top surface of the metal hardmask layer 40.

Figure 15:
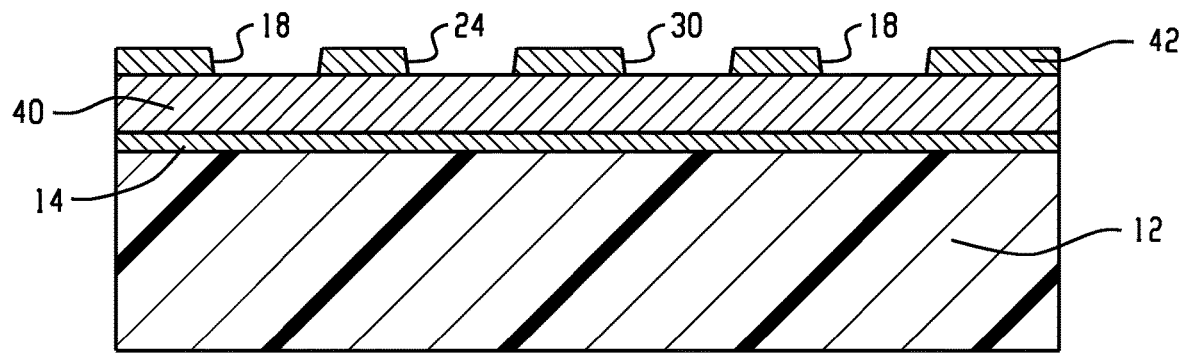

With reference to FIG. 15 in which like reference numerals refer to like features in FIG. 14 and at a subsequent fabrication stage, the layers 22, 44, and 20 are sequentially removed by etching and/or stripping processes using suitable etch chemistries. The removal of layer 20 clears the openings 18 in the dielectric layer 42. The openings 18, 24, 30 are now opened in the hardmask layer 14.

Figure 16:
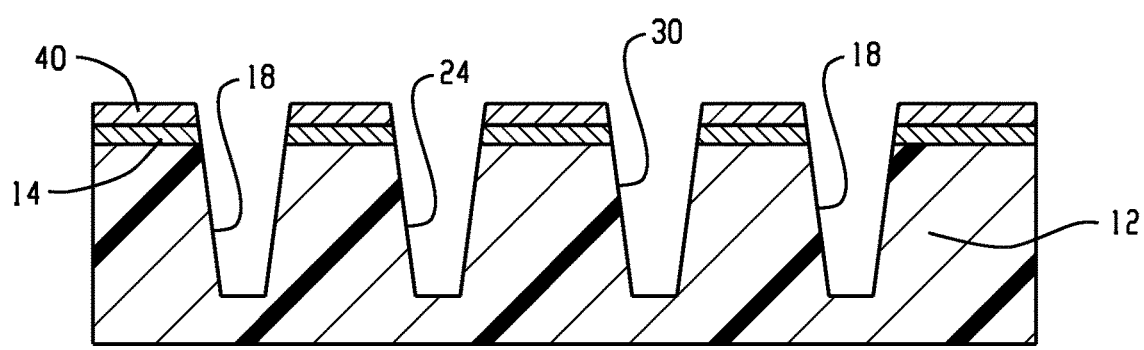

With reference to FIG. 16 in which like reference numerals refer to like features in FIG. 15 and at a subsequent fabrication stage, the hardmask layer 14 is etched by an etching process using an etch chemistry selected to remove the constituent material of the metal hardmask layer 40 selective to the material of the dielectric layer 12 in order to extend the openings 18, 24, and 30 in the metal hardmask layer 40 through the hardmask layer 14 and to the top surface of the dielectric layer 12. In the course of this etching process, the resist layer 18 functions as an etch mask during patterning of the hardmask layer 14.

The dielectric layer 12 is etched by an etching process using an etch chemistry selected to remove the constituent material of the dielectric layer 12 selective to the materials of the resist layer 16 and the hardmask layer 14 in order to extend the openings 18, 24, and 30 in the resist layer 16 to a given depth of penetration into the dielectric layer 12. In the course of this etching process, the resist layer 16 and the hardmask layer 14 function as an etch mask during patterning of the dielectric layer 12. The etching process used to etch the dielectric layer 12 may comprise a wet chemical etching process or a dry etching process, such as RIE. This etching process may reduce the thickness of the metal hardmask layer 40.

The process to fill the openings 18, 24, 30 continues as described hereinabove with reference to FIGS. 8, 9 other than the metal hardmask layer 40, instead of the resist layer 16, is removed using either a dry or wet clean.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an interconnect level, the method comprising:
   forming a hardmask layer on a dielectric layer;
   forming a first sacrificial layer on the hardmask layer;
   forming a first opening and a second opening in the first sacrificial layer that extend through the first sacrificial layer to the hardmask layer;
   forming a first resist layer on the first sacrificial layer; and
   forming a third opening that extends through the first resist layer and that is laterally located between the first opening in the first sacrificial layer and the second opening in the first sacrificial layer,
   wherein the first resist layer is comprised of a metal oxide resist material.

2. The method of claim 1 further comprising:
   forming a second resist layer on the first resist layer; and
   forming an opening that extends through the second resist layer and that is laterally located between the first opening in the first sacrificial layer and the second opening in the first sacrificial layer.

3. The method of claim 2 wherein the second resist layer is comprised of the metal oxide resist material.

4. The method of claim 2 further comprising:
   extending the opening in the second resist layer through the first resist layer to form a fourth opening in the first resist layer that is laterally located between the first opening in the first sacrificial layer and the second opening in the first sacrificial layer.

5. The method of claim 4 wherein extending the opening in the second resist layer through the first resist layer comprises:
   removing the second resist layer,
   wherein the fourth opening is formed in the first resist layer when the second resist layer is removed.

6. The method of claim 4 wherein a second sacrificial layer is located between the first resist layer and the second resist layer and includes a portion filling the third opening in the first resist layer, and further comprising:
   after the fourth opening is formed in the first resist layer, removing the second resist layer,
   wherein the opening in the second resist layer is extended through the first resist layer to form the fourth opening in the first resist layer when the second resist layer is removed, and the second resist layer is removable selective to the second sacrificial layer.

7. The method of claim 1 wherein forming the first opening and the second opening in the first sacrificial layer that extend to the hardmask layer comprises:
   exposing the first sacrificial layer to a pattern of radiation from an exposure source projected through a photomask; and
   after exposing the first sacrificial layer, developing with a chemical developer to form the first opening and the second opening in the first sacrificial layer.

8. The method of claim 7 wherein the first sacrificial layer is comprised of the metal oxide resist material.

9. The method of claim 7 wherein a second sacrificial layer is located between the first sacrificial layer and the first resist layer and has portions respectively filling the first opening in the first sacrificial layer and the second opening in the first sacrificial layer, and the second sacrificial layer is comprised of a dielectric material that is removable selective to the first resist layer and selective to the first sacrificial layer.

10. The method of claim 9 further comprising:
    extending the third opening in the first resist layer through the second sacrificial layer to form a third opening in the first sacrificial layer; and
    after the third opening is formed in the first sacrificial layer, removing the first resist layer.

11. The method of claim 10 further comprising
    after removing the first resist layer, removing the second sacrificial layer and the portions of the second sacrificial layer from the first opening in the first sacrificial layer and the second opening in the first sacrificial layer.

12. The method of claim 11 further comprising:
    concurrently extending the first opening, the second opening, and the third opening in the first sacrificial layer through the hardmask layer to form a plurality of openings in the hardmask layer.

13. The method of claim 12 further comprising:
    concurrently extending the openings in the hardmask layer through the dielectric layer to form a plurality of openings in the dielectric layer; and
    filling the openings in the dielectric layer with a metal to form conductive features of an interconnect structure.

14. The method of claim 1 wherein a second sacrificial layer is located between the first sacrificial layer and the first resist layer and has portions respectively filling the first opening in the first sacrificial layer and the second opening in the first sacrificial layer, and the second sacrificial layer is removable selective to the first resist layer and selective to the first sacrificial layer.

15. The method of claim 14 wherein a third sacrificial layer located between the second sacrificial layer and the first resist layer, and the third sacrificial layer is removable selective to the first resist layer and selective to the second sacrificial layer.

16. The method of claim 15 further comprising:
    forming a fourth opening in the first resist layer that is laterally located between the first opening in the first sacrificial layer and the first opening in the first resist layer.

17. The method of claim 16 further comprising:
    extending the fourth opening in the first resist layer through the third sacrificial layer to form a first opening in the third sacrificial layer; and
    extending the first opening in the third sacrificial layer through the second sacrificial layer to form a first opening in the second sacrificial layer.

18. The method of claim 17 further comprising:
    concurrently extending the third opening in the first resist layer through the third sacrificial layer to form a second opening in the third sacrificial layer and the first opening in the second sacrificial layer through the first sacrificial layer to form a third opening in the first sacrificial layer.

19. The method of claim 18 further comprising:

extending the second opening in the third sacrificial layer through the second sacrificial layer and the first sacrificial layer to form a fourth opening in the first sacrificial layer; and removing the second sacrificial layer and the portions of the second sacrificial layer respectively filling the first opening in the first sacrificial layer and the second opening in the first sacrificial layer.

20. The method of claim 19 further comprising:

concurrently extending the first opening, the second opening, the third opening, and the fourth opening in the first sacrificial layer into the hardmask layer to form a plurality of openings in the hardmask layer;

concurrently extending the openings in the hardmask layer into the dielectric layer to form a plurality of openings in the dielectric layer; and filling the openings in the dielectric layer with a metal to form conductive features of an interconnect structure.

* * * * *